(12) United States Patent
Chen

(10) Patent No.: US 7,817,416 B2
(45) Date of Patent: Oct. 19, 2010

(54) MOUNTING APPARATUS FOR FAN

(75) Inventor: Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 36 days.

(21) Appl. No.: 12/346,865

(22) Filed: Dec. 31, 2008

(65) Prior Publication Data

US 2010/0097753 A1    Apr. 22, 2010

(30) Foreign Application Priority Data

Oct. 20, 2008   (CN) .................. 2008 1 0305028

(51) Int. Cl.
   *H05K 7/20* (2006.01)
(52) U.S. Cl. .................. 361/679.48; 361/695; 361/697; 165/122; 454/184
(58) Field of Classification Search ............ 361/679.46, 361/679.48, 688, 689, 690, 692–697, 175, 361/719–727, 831; 454/184; 165/80.3, 104.33, 165/104.34, 121–126, 185; 415/108, 119, 415/213.1, 214.1, 232, 220; 417/360, 423.5–423.15; 416/244 R, 247 R
See application file for complete search history.

(56) References Cited

U.S. PATENT DOCUMENTS

| | | | | |
|---|---|---|---|---|
| 5,208,730 A * | 5/1993 | Tracy | .................... | 361/679.48 |
| 5,713,790 A * | 2/1998 | Lin | .......................... | 454/184 |
| 5,906,475 A * | 5/1999 | Melane et al. | ........... | 415/214.1 |
| 6,189,848 B1 * | 2/2001 | Barnett et al. | .......... | 248/231.81 |
| 6,493,225 B2 * | 12/2002 | Chuang et al. | .............. | 361/695 |
| 6,611,427 B1 * | 8/2003 | Liao | .......................... | 361/695 |
| 6,999,313 B2 * | 2/2006 | Shih | .......................... | 361/695 |
| 7,009,841 B2 * | 3/2006 | Chen et al. | .................. | 361/695 |
| 7,186,075 B2 * | 3/2007 | Winkler et al. | ............. | 415/119 |
| 7,306,425 B2 * | 12/2007 | Park et al. | .................... | 415/119 |
| 7,312,991 B2 * | 12/2007 | Lee et al. | .................... | 361/695 |
| 7,411,788 B2 * | 8/2008 | Liang | ......................... | 361/695 |
| 7,413,402 B2 * | 8/2008 | Kang et al. | .............. | 415/213.1 |
| 7,466,545 B2 * | 12/2008 | Hung | .................... | 361/679.48 |
| 7,515,413 B1 * | 4/2009 | Curtis | ........................ | 361/695 |
| 7,589,966 B2 * | 9/2009 | Ong et al. | ................... | 361/695 |
| 2009/0147973 A1 * | 6/2009 | Gitzinger et al. | ............ | 381/190 |

* cited by examiner

*Primary Examiner*—Michael V Datskovskiy
(74) *Attorney, Agent, or Firm*—Zhigang Ma

(57) ABSTRACT

A mounting apparatus is provided for mounting a fan in a chassis defining an exhaust opening in an end wall thereof. The mounting apparatus includes a frame adapted to receive the fan, and be inserted into or drawn out of the chassis via the exhaust opening. The frame includes at least one resilient lock plate. The at least one resilient lock plate releasably abuts against the end wall of the chassis to prevent the frame sliding out of the chassis.

13 Claims, 3 Drawing Sheets

MOUNTING APPARATUS FOR FAN

BACKGROUND

1. Technical Field

The present disclosure relates to mounting apparatuses and, more particularly, to a mounting apparatus for securing a fan in a computer system.

2. Description of Related Art

In a typical computer system, a plurality of fans is secured by screws or the like to a chassis of the computer system and used for producing a flow of cooling air over certain electrical components within the chassis, dissipating heat generated by the electrical components so that the components operate within a desired temperature range. When the fans are installed or removed from the chassis, a cover of the chassis should be removed to expose the fans to gain access with the proper tool. The installation or removal of the screws is time consuming and troublesome. In addition, during installation or removal of the screws, the computer system should be shut down which may be inconvenient.

DETAILED DESCRIPTION

Figure 1:
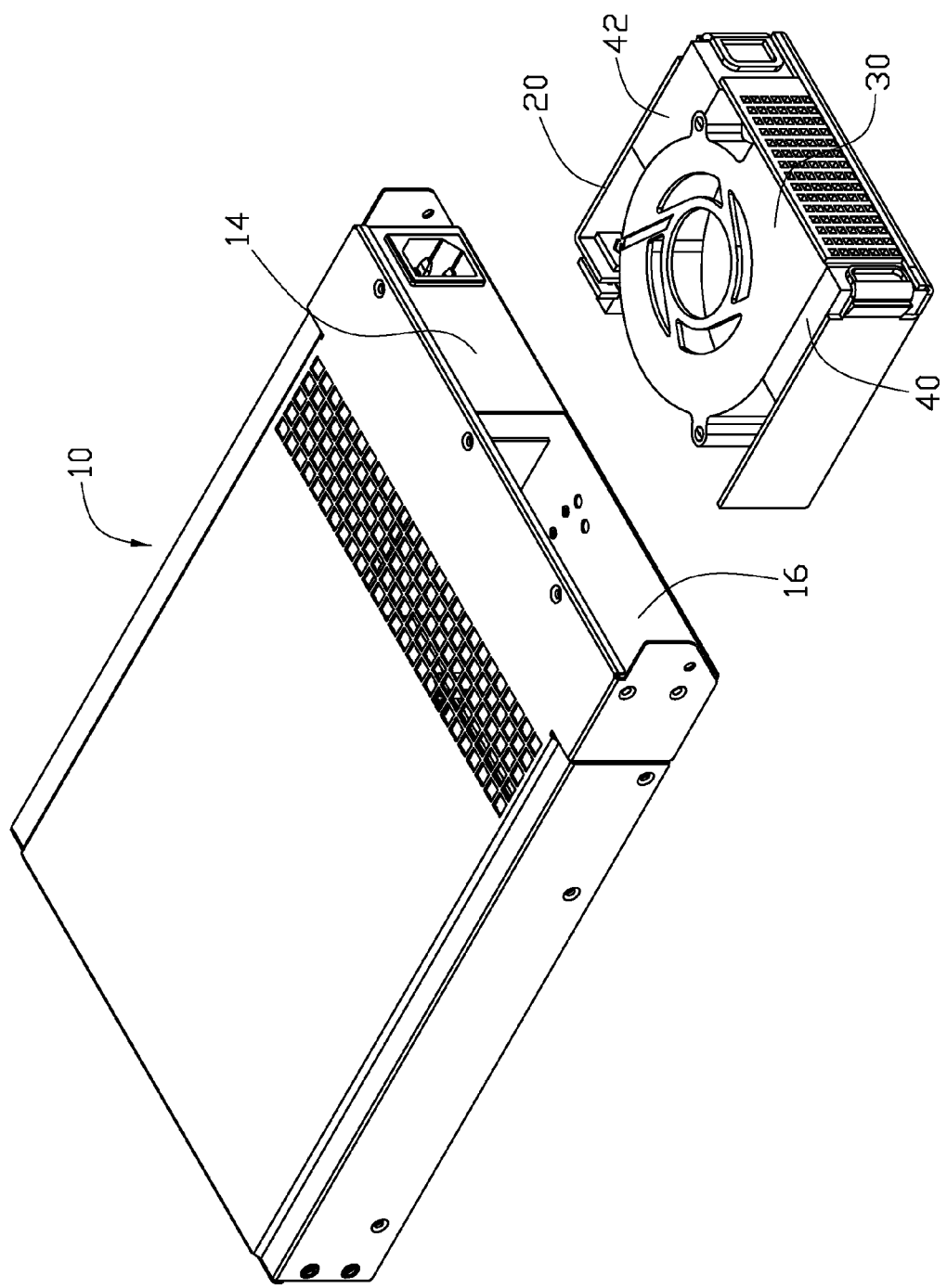
FIG. 1 is a partially exploded, isometric view of an exemplary embodiment of a mounting apparatus with a fan secured therein, and a chassis.
Figure 2:
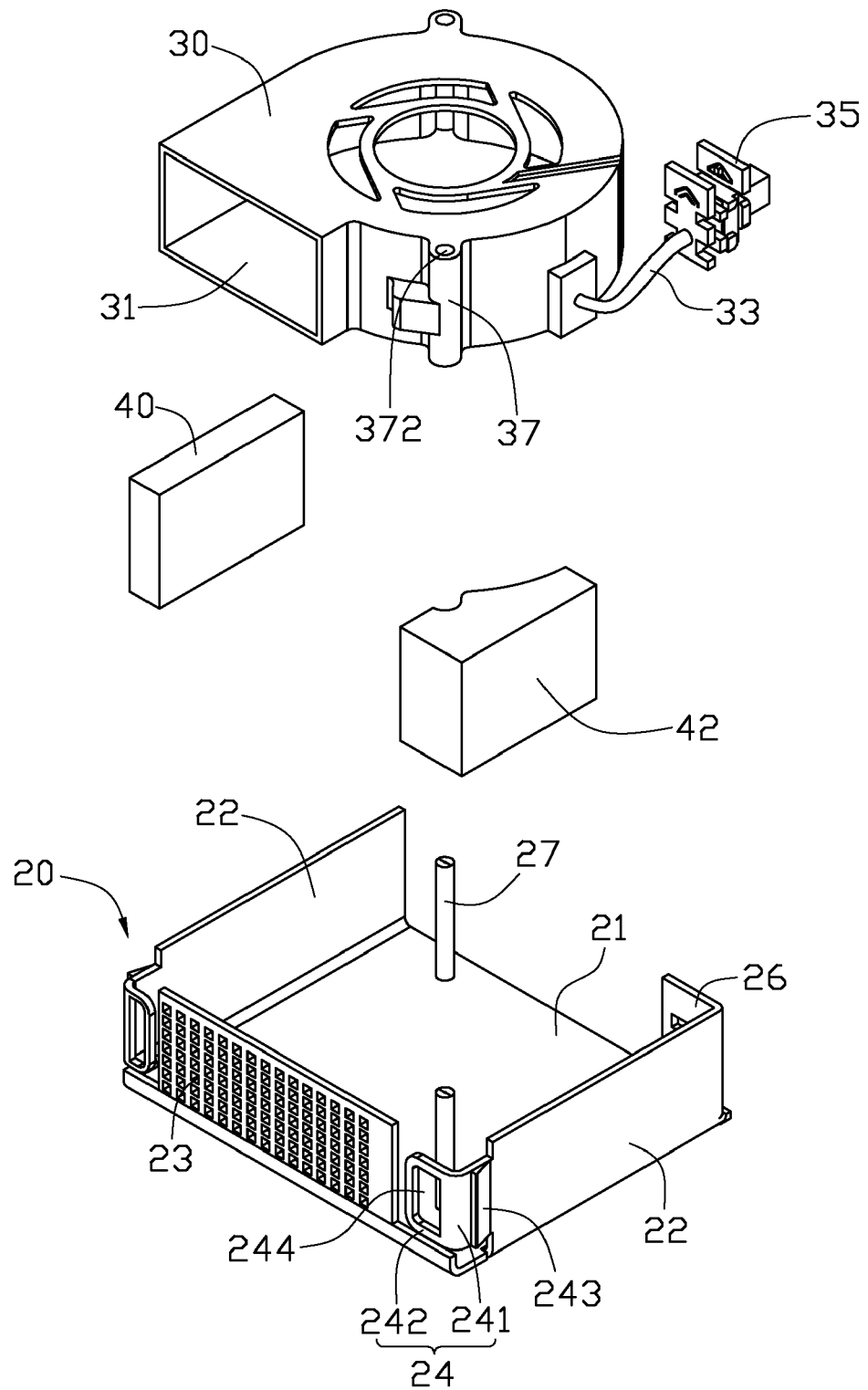
FIG. 2 is an exploded, isometric view of the mounting apparatus and the fan of FIG. 1.

Referring to FIGS. 1 and 2, an embodiment of a mounting apparatus is provided for mounting a fan 30 to a chassis 10 of a computer system. The mounting apparatus includes a frame 20 adapted to receive the fan 30, and two cushions 40, 42, which are configured to abut against opposite sides of the fan 30.

The chassis 10 defines an exhaust opening 16 in an end wall 14 thereof, for exhausting the hot air from the chassis 10. There is at least one power socket (not shown) mounted in the chassis 10.

The fan 30 includes an outlet 31, a power line 33, and a plug 35 connected to a free end of the power line 33. The plug 35 is adapted to be plugged in the power socket of the chassis 10 for electrically driving the fan 30. A pair of protrusions 37 is disposed at an outside surface of the fan 30. Each protrusion 37 defines a positioning hole 372.

The frame 20 includes a bottom wall 21, a pair of parallel sidewalls 22 perpendicularly extending from opposite edges of the bottom wall 21, and a venting plate 23 perpendicularly extending from another edge of the bottom wall 21 and substantially perpendicular to the sidewalls 22. A pair of positioning posts 27 perpendicularly extends from the bottom wall 21, and is adapted to be received in the positioning holes 372 of the protrusions 37 of the fan 30. The venting plate 23 defines a plurality of vents. Each of the sidewalls 22 includes an L-shaped locking plate 24 extending from an end thereof near the venting plate 23. Each of the locking plates 24 includes a pressing portion 241 with an end connected to the corresponding sidewall 22, and an operating portion 242 perpendicularly extending from another end of the pressing portion 241 far away from the corresponding sidewall 22. A wedged block 243 protrudes from an outside surface of each of the pressing portions 241. Each of the blocks 243 includes a stopping end perpendicular to the pressing portions 241 and a guiding slope slantingly extending from the pressing portions 241. Each of the operating portions 242 defines a receiving hole 244 adapted to allow a user's fingers to extend therein. A fixing portion 26 perpendicularly extends from another end of one of the sidewalls 22 far away from venting plate 23.

In assembly, the two cushions 40, 42 are respectively attached to inner surfaces of the two sidewalls 22 of the frame 20. The fan 30 is retained in the frame 20 by securing the positioning posts 27 in the positioning holes 372 of the protrusions 37 of the fan 30. The outlet 31 of the fan 30 aligns with the venting plate 23 of the frame 20. The cushions 40, 42 are sandwiched between the fan 30 and the corresponding sidewalls 22 of the frame 20 for shock absorption. The plug 35 is fixed in the fixing portion 26 and extends out of the frame 20.

Figure 3:
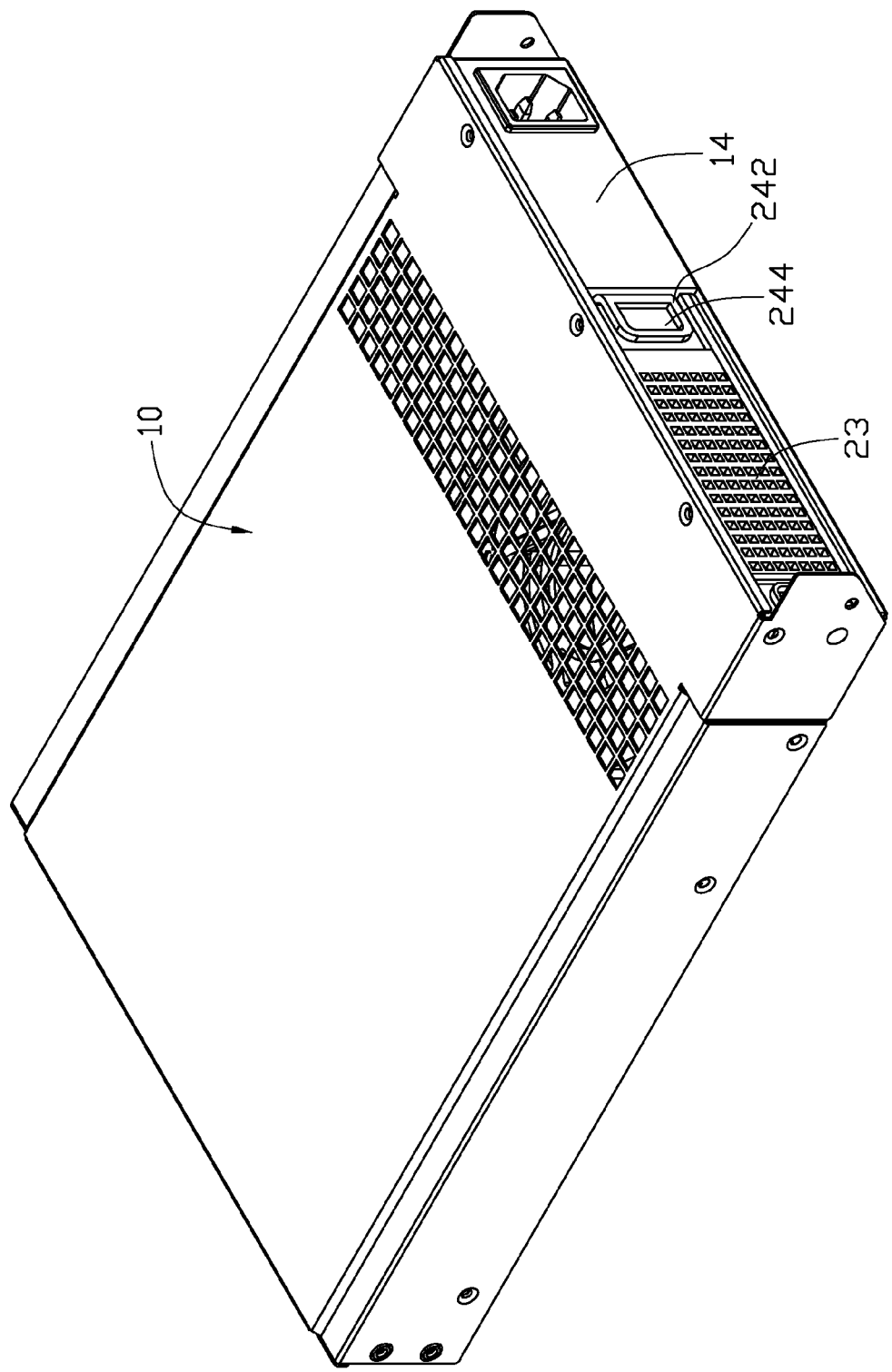
FIG. 3 is an assembled, isometric view of the mounting apparatus, the fan, and the chassis of FIG. 1.

Referring also to FIG. 3, to mount the frame 20 with the fan 30 retained therein in the chassis 10, the frame 20 is inserted into the chassis 10 via the exhaust opening 16. When the guiding slopes of the blocks 243 abut against edges of the end wall 14 of the chassis 10 at opposite sides of the opening 16, the pressing portions 241 of the locking plates 24 are urged to be deformed and move towards each other. When the frame 20 is fully received in the chassis 10, the venting plate 23 shields the exhaust opening 16 of the chassis 10 and the plug 35 is electrically coupled to the power socket in the chassis 10. At the same time, the pressing portions 241 restore, and the stopping ends of the blocks 243 abut against an inner surface of the end wall 14 of the chassis 10 beside the exhaust opening 16, therefore, the frame 20 is prevented from sliding out of the chassis 10, and the fan 30 is secured in the chassis 10.

To detach the frame 20 from the chassis 10, since the operating portion 242 is exposed in the exhaust opening 16 of the chassis 10, fingers can extend into the receiving holes 244 of the operating portions 242 of the locking plate 24 for driving the operating portions 24 to move toward each other. The pressing portions 241 are deformed and the blocks 243 disengage from the end wall 14 of the chassis 10, therefore, the frame 20 is capable of being drawn out of the chassis 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for mounting a fan in a chassis defining an exhaust opening in an end wall, the mounting apparatus comprising:

a frame configured to receive the fan and capable of being inserted into or drawn out of the chassis via the exhaust opening, the frame comprising a bottom wall, at least one sidewall perpendicularly cantilevering from a first edge of the bottom wall, a venting plate perpendicularly extending from a second edge of the bottom wall neighboring the first edge, and at least one resilient locking plate extending from a first end of the at least one sidewall towards the venting plate;

wherein the at least one resilient locking plate releasably abuts against the chassis to prevent the frame from sliding out of the chassis, and disengaging from the chassis by urging a free end of the locking plate to move in a direction perpendicular to the side wall of the frame.

2. The mounting apparatus of claim 1, wherein the venting plate shields the opening of the chassis if the frame is fully received in the chassis.

3. The mounting apparatus of claim 2, wherein the fan comprises an outlet; when the fan is retained in the frame, the outlet of the fan aligns with the venting plate of the frame.

4. The mounting apparatus of claim 2, wherein the at least one locking plate is L-shaped and comprises a pressing portion connected to the first end of the at least one sidewall, and an operating portion perpendicularly extending towards the venting plate and from an end of the pressing portion far away from the at least one sidewall.

5. The mounting apparatus of claim 4, wherein the pressing portion comprises a wedged block protruding from a surface thereof, and configured for abutting against the end wall of chassis.

6. The mounting apparatus of claim 1, wherein the fan forms two protrusions on an outside surface thereof, each of the protrusions defines a positioning hole; two positioning posts perpendicularly extend from the bottom wall and adapted to be secured in the positioning holes.

7. The mounting apparatus of claim 1, wherein the fan comprises a plug; the frame further comprises a fixing portion extending from a second end of the at least one sidewall far away from the at least one locking plate, and configured to fix the plug of the fan.

8. The mounting apparatus of claim 1 further comprising at least one cushion sandwiched between the frame and the fan.

9. A chassis assembly capable of receiving a fan, the fan comprising a plug, the chassis assembly comprising:
 a chassis comprising a socket therein, and defining an exhaust opening in an end wall thereof, hot air in the chassis exhausted out via the exhaust opening;
 a frame adapted to receive the fan, and capable of being inserted into or drawn out of the chassis via the exhaust opening, the frame releasably locked in the chassis, and comprising an operating portion exposed in the exhaust opening and manipulated to unlock the frame from chassis;
 wherein the frame comprises a bottom wall, at least one sidewall perpendicularly extending from an edge of the bottom wall, and a locking plate extending from a first end of the at least one sidewall, the operating portion is formed on an end of the locking plate far away from the at least one sidewall.

10. The chassis assembly of claim 9, wherein the locking plate comprises a pressing portion having opposite ends respectively connected to the at least one sidewall and the operating portion.

11. The chassis assembly of claim 9, wherein the frame further comprises a venting plate perpendicularly extending from another edge of the bottom wall adjacent to the locking plate; when the frame is fully received in the chassis, the venting plate shields the opening of the chassis.

12. The chassis assembly of claim 11, wherein the fan comprises an outlet; when the fan is retained in the frame, the outlet of the fan aligns with venting plate of the frame.

13. A mounting apparatus for mounting a fan in a chassis defining an exhaust opening in an end wall, the mounting apparatus comprising:
 a frame configured to receive the fan and capable of being inserted into or drawn out of the chassis via the exhaust opening, the frame comprising at least one resilient locking plate;
 wherein the at least one resilient locking plate releasably abuts against the chassis to prevent the frame from sliding out of the chassis;
 wherein the frame comprises a bottom wall, at least one side wall perpendicularly extends from an edge of the bottom wall, the at least one lock plate is connected to a first end of the at least one sidewall; and
 wherein the fan comprises a plug; the frame further comprises a fixing portion extending from a second end of the at least one sidewall far away from the at least one locking plate, and configured to fix the plug of the fan.

* * * * *